US010763072B1

(12) United States Patent
Sinclair et al.

(10) Patent No.: US 10,763,072 B1
(45) Date of Patent: Sep. 1, 2020

(54) APPARATUS, SYSTEM AND TECHNIQUES FOR MASS ANALYZED ION BEAM

(71) Applicant: APPLIED Materials, Inc., Santa Clara, CA (US)

(72) Inventors: Frank Sinclair, Boston, MA (US); Costel Biloiu, Rockport, MA (US); Joseph C. Olson, Beverly, MA (US); Alexandre Likhanskii, Malden, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/354,638

(22) Filed: Mar. 15, 2019

(51) Int. Cl.
*H01J 37/05* (2006.01)
*H01J 37/317* (2006.01)
*H01J 37/147* (2006.01)

(52) U.S. Cl.
CPC .......... *H01J 37/05* (2013.01); *H01J 37/1472* (2013.01); *H01J 37/3171* (2013.01); *H01J 2237/057* (2013.01)

(58) Field of Classification Search
CPC ......... H01J 37/05; H01J 37/3174; H01J 49/36
See application file for complete search history.

(56) References Cited

U.S. PATENT DOCUMENTS

| 6,730,904 B1 | 5/2004 | Wells |
| 8,796,619 B1 | 8/2014 | Doroshenko et al. |
| 2002/0166961 A1 | 11/2002 | Berggren et al. |
| 2010/0057372 A1 | 3/2010 | Fagerquist et al. |
| 2015/0380227 A1* | 12/2015 | Hotta ............... H01J 49/26 250/291 |
| 2018/0174812 A1 | 6/2018 | Cheng et al. |
| 2018/0218894 A1 | 8/2018 | Likhanskii |
| 2018/0286653 A1* | 10/2018 | Sinclair ............... H01J 37/05 |

OTHER PUBLICATIONS

"Electrospray Ionization on a Reflecting Time-of-Flight Mass Spectrometer," Authors: A. F. Dodonov, I. V. Chernushevich, and V. V. Laiko, Cotter; Time-of-Flight Mass Spectrometry, ACS Symposium Series; American Chemical Society: Washington, DC, 1993, 16 pages.
International Search Report dated Jun. 16, 2020 for the International Patent Application No. PCT/US2020/017845, filed on Feb. 12, 2020, 3 pages.
Written Opinion dated Jun. 16, 2020 for the International Patent Application No. PCT/US2020/017845, filed on Feb. 12, 2020, 4 pages.

* cited by examiner

*Primary Examiner* — Eliza W Osenbaugh-Stewart

(57) ABSTRACT

An apparatus may include a housing including an entrance aperture, to receive an ion beam. The apparatus may include an exit aperture, disposed in the housing, downstream to the entrance aperture, the entrance aperture and the exit aperture defining a beam axis, extending therebetween. The apparatus may include an electrodynamic mass analysis assembly disposed in the housing and comprising an upper electrode assembly, disposed above the beam axis, and a lower electrode assembly, disposed below the beam axis. The apparatus may include an AC voltage assembly, electrically coupled to the upper electrode assembly and the lower electrode assembly, wherein the upper electrode assembly is arranged to receive an AC signal from the AC voltage assembly at a first phase angle, and wherein the lower electrode assembly is arranged to receive the AC signal at a second phase angle, the second phase angle 180 degrees shifted from the first phase angle.

19 Claims, 6 Drawing Sheets

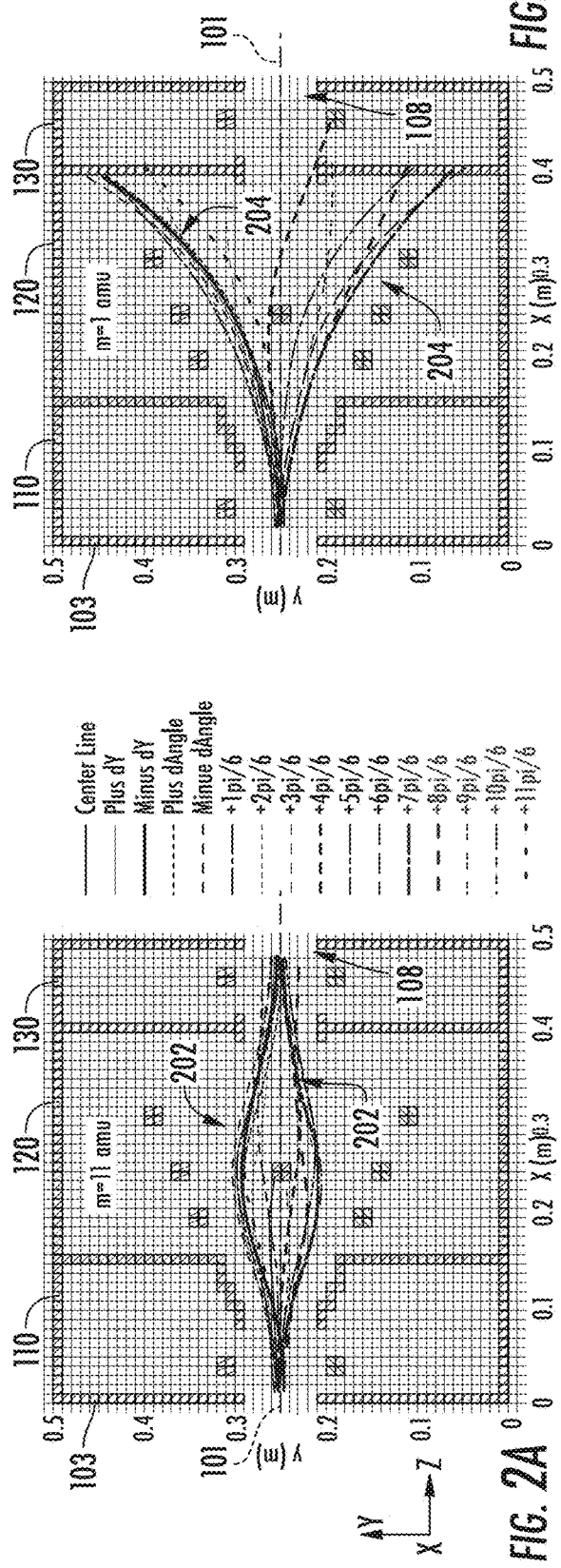
FIG. 2A
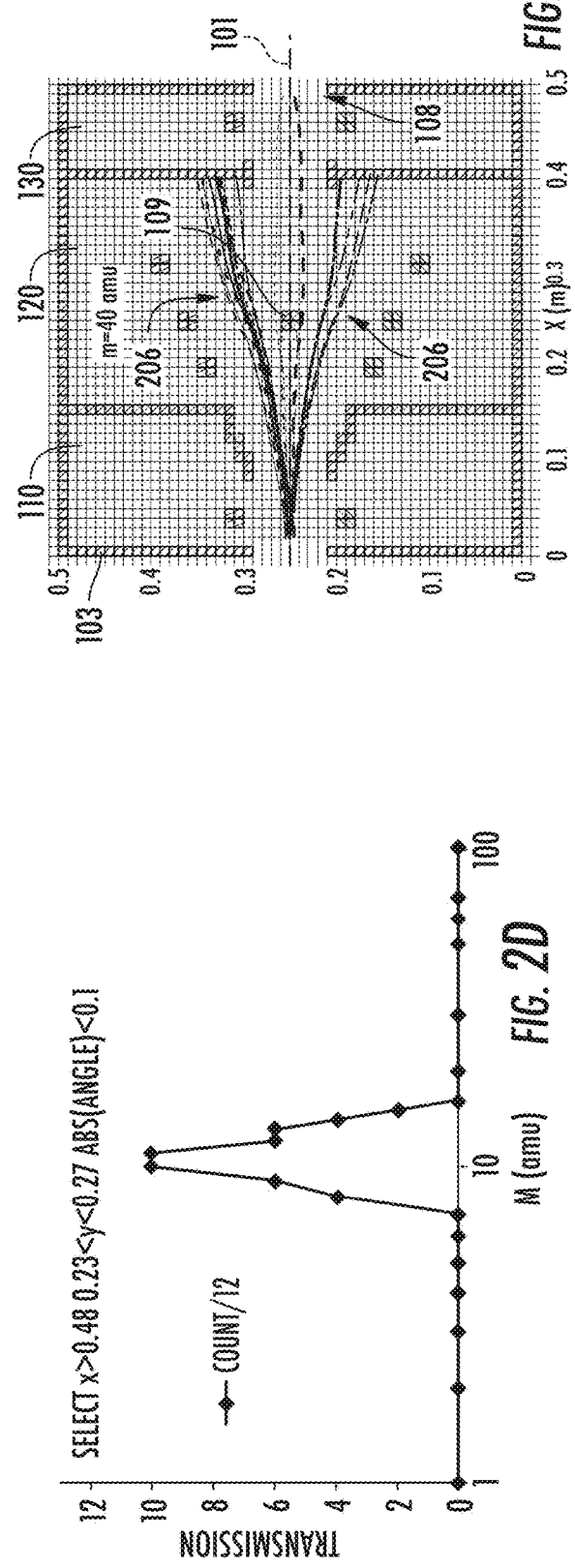
FIG. 2B
FIG. 2C
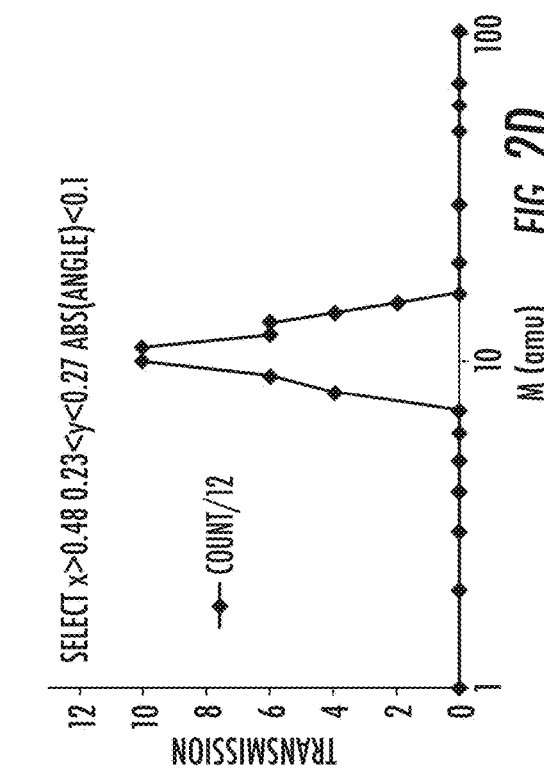
FIG. 2D

US 10,763,072 B1

APPARATUS, SYSTEM AND TECHNIQUES FOR MASS ANALYZED ION BEAM

FIELD OF THE DISCLOSURE

The disclosure relates generally to ion beam apparatus and more particularly to ion implanters having mass analysis.

BACKGROUND OF THE DISCLOSURE

Ion implantation is a process of introducing dopants or impurities into a substrate via bombardment. Ion implantation systems ("ion implanters") may comprise an ion source and a substrate stage or process chamber, housing a substrate to be implanted. The ion source may comprise a chamber where ions are generated. Beamline ion implanters may include a series of beam-line components, for example, a mass analyzer, a collimator, and various components to accelerate or decelerate the ion beam.

A useful function of an ion implanter beamline is to separate ions of different masses so that an ion beam may be formed having the desired ions for treating the work piece or substrate, while undesirable ions are intercepted in a beamline component and do not reach the substrate. In known systems, this mass analysis function is provided by an analyzing magnet, which component bends a beam of ions that all have the same energy in a curve whose radius depends on the ion mass, thus achieving the required separation. Magnets of this kind, however, are large, expensive and heavy and represent a significant fraction of the cost and power consumption of an ion implanter.

For relatively lower energy ion implantation, such as energy below approximately 50 keV, compact ion beam systems have been developed. These ion beam systems may include a plasma chamber acting as ion source, and placed adjacent a process chamber, housing the substrate to be implanted. An ion beam may be extracted from the plasma chamber using an extraction grid or other extraction optics to provide an ion beam to the substrate, with a desired beam shape, such as a ribbon beam. In these latter systems, mass analysis may be omitted because of size/space considerations for installing a magnetic analyzer, as discussed above, as well as cost. Thus, the use of such compact ion beam systems may be limited to applications where purity of implanting species is not a strict requirement.

With respect to these and other considerations, the present disclosure is provided.

BRIEF SUMMARY

In one embodiment, an apparatus may include a housing including an entrance aperture, to receive an ion beam, and an exit aperture, disposed in the housing, downstream to the entrance aperture, where the entrance aperture and the exit aperture define a beam axis, extending therebetween. The apparatus may include an electrodynamic mass analysis assembly disposed in the housing and comprising an upper electrode assembly, disposed above the beam axis, as well as a lower electrode assembly, disposed below the beam axis. The apparatus may include an AC voltage assembly, electrically coupled to the upper electrode assembly and the lower electrode assembly. The upper electrode assembly may be arranged to receive an AC signal from the AC voltage assembly at a first phase angle, and the lower electrode assembly may be arranged to receive the AC signal at a second phase angle, the second phase angle being 180 degrees shifted from the first phase angle.

In another embodiment, a system may include an ion source, disposed to generate an ion beam and an electrodynamic mass analysis device. The electrodynamic mass analysis device may include an entrance aperture, disposed to receive the ion beam and an exit aperture, disposed downstream to the entrance aperture, where the entrance aperture and the exit aperture define a beam axis, extending therebetween. The electrodynamic mass analysis device may further include an upper electrode assembly, disposed above the first axis; and a lower electrode assembly, disposed below the first axis. The system may also include a process chamber, disposed downstream of the exit aperture, the process chamber comprising a substrate stage, and an AC voltage assembly, electrically coupled to the upper electrode assembly and the lower electrode assembly.

In a further embodiment, a method of processing an ion beam may include generating the ion beam as a continuous ion beam and directing the continuous ion beam along a beam axis into an electrodynamic mass analysis (EDMA) device. The EDMA device may include an upper electrode assembly, disposed above the beam axis, and a lower electrode assembly, disposed below the beam axis. The method may include conducting the continuous ion beam through the EDMA device while applying an AC voltage signal at a target frequency and a target voltage amplitude to the upper electrode assembly and to the lower electrode assembly. As such, a target ion species having a first mass may exit the EDMA device along the first axis, wherein an impurity ion species having a second mass, different from the first mass does not exit the EDMA device along the first axis, and wherein a mass analyzed ion beam exits the EDMA device.

BRIEF DESCRIPTION OF THE DRAWINGS

FIG. 2A shows the trajectories of a target ion species according to one scenario for operating the apparatus of FIG. 1A, according to other embodiments of the disclosure;

FIG. 2B shows the trajectories of an impurity ion species according to the scenario of FIG. 2A;

FIG. 2C shows the trajectories of another impurity ion species according to the scenario of FIG. 2A;

FIG. 2D shows a calculated filter profile for the apparatus of FIG. 1A;

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for mass analyzed ion implantation systems, using a novel mass analysis device. In various embodiments the mass analysis device may be implemented in beamline ion implanters or in compact ion beam systems.

Figure 1B:
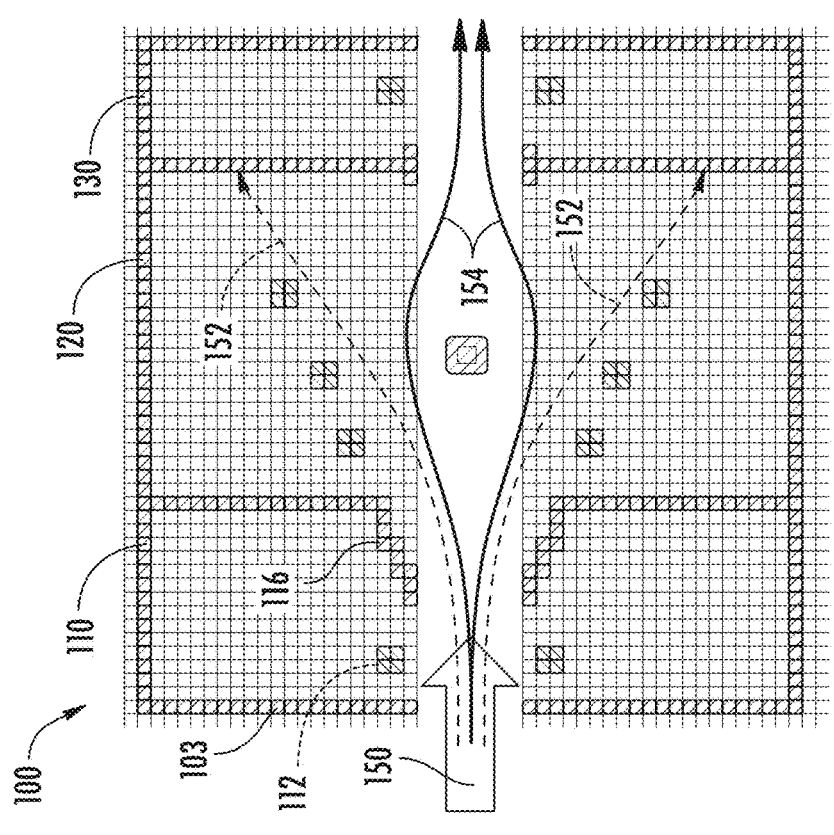
FIG. 1B depicts the geometry for mass analysis of an ion beam using the apparatus of FIG. 1A.
Figure 1B:
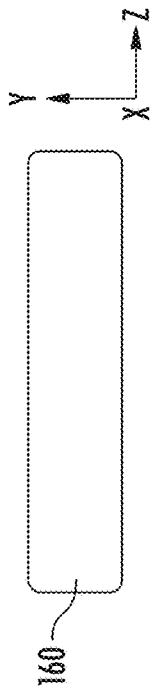
Figure 1A:
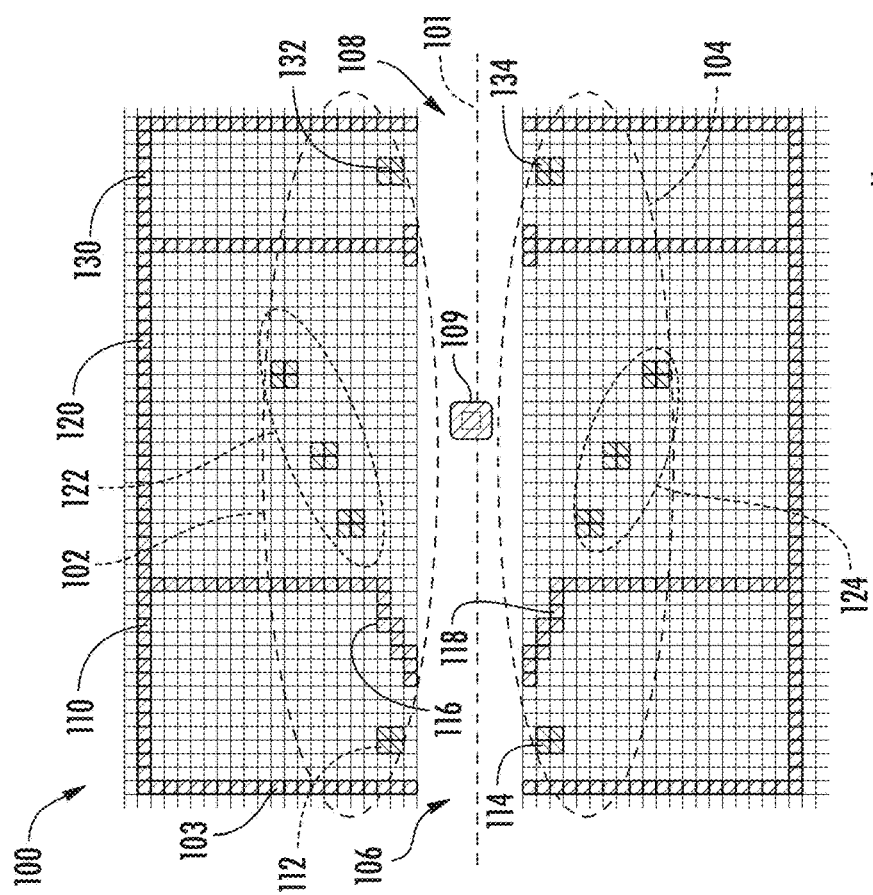
FIG. 1A shows an exemplary apparatus, according to embodiments of the disclosure.
Figure 1A:
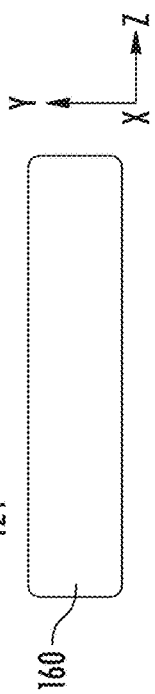

FIG. 1A depicts an apparatus 100, according to various embodiments of the disclosure. The apparatus 100 may generally act as a mass filter, referred to herein as an electrodynamic mass analysis (EDMA) device. According to various embodiments, the apparatus 100 may be deployed in a compact ion beam system, or alternatively, in a beamline ion implantation system (ion implanter). For purposes of clarity, the structure of the apparatus 100 may be shown in somewhat idealized form, where the relative dimensions of various portions or parts of the apparatus 100 may or may not be drawn to scale.

As shown in FIG. 1A the apparatus 100 may include an enclosure 103 including an entrance aperture 106, to receive an ion beam, as well as an exit aperture 108, disposed downstream to the entrance aperture 106. The entrance aperture 106 and the exit aperture 108 may define a beam axis 101, extending between the entrance aperture 106 and the exit aperture 108. In the example of FIG. 1A, the beam axis 101 lies parallel to the Z-axis of the Cartesian coordinate system shown. As detailed with respect to the various figures to follow, the apparatus 100 may be operated in a manner where select ions of a desired mass enter through entrance aperture 106 having trajectories generally parallel to the beam axis 101 and exit through the exit aperture generally parallel to the beam axis 101, while being deflected along different trajectories within the interior of the apparatus 100.

To perform mass analysis, the apparatus 100 may include an electrodynamic mass analysis assembly, including an upper electrode assembly 102, disposed above the beam axis 101, and a lower electrode assembly 104, disposed below the beam axis 101.

In some embodiments, the upper electrode assembly 102 and the lower electrode assembly 104 may include a plurality of electrodes, where the plurality of electrodes are elongated along an electrode axis (represented by the X-axis) where the electrode axis extends perpendicularly to the beam axis. This configuration may be especially suitable for treating ribbon beams, where the ribbon beam is characterized by a long axis in cross-section extending along the X-axis. However, in other embodiments the electrodes of the apparatus 100 may treat a spot or pencil beam having a more equiaxed shape in cross-section.

The upper electrode assembly 102 may include an upper entrance electrode 112, disposed in an entrance chamber 110, a main upper electrode assembly 122, disposed in a main chamber 120, downstream to the upper entrance electrode 112, and an upper exit electrode 132, disposed downstream to the main upper electrode assembly 122.

The lower electrode assembly 104 may include a lower entrance electrode 114, disposed in the entrance chamber 110, a main lower electrode assembly 124, disposed in the main chamber 120, and a lower exit electrode 134, disposed downstream to the main lower electrode assembly 124.

According to various embodiments, the main upper electrode assembly 122 and the main lower electrode assembly 124 may define a flared relationship, wherein a separation between the main upper electrode assembly and the main lower electrode assembly increases between an upstream position of the main chamber and a downstream position of the main chamber. This flared relationship may aid in reducing ion impacts from an ion beam traveling through the enclosure 103.

As shown in FIG. 1A, the apparatus 100 may also include a beam blocker 109, disposed in the main chamber 120, and extending across the beam axis 101. The beam blocker 109 may be set at ground potential, where the operation of beam blocker 109 is further detailed below.

The apparatus 100 may include a ground tunnel in the entrance chamber 110, disposed downstream of the upper entrance electrode 112 and the lower entrance electrode 114. As shown in FIG. 1A, the ground tunnel may include an upper portion 116, disposed above the beam axis 101 and a lower portion 118, disposed below the beam axis 101. In various embodiment, the ground tunnel may also be characterized by a flared shape in the Y-Z plane, as shown in FIG. 1.

The apparatus 100 may include an AC voltage assembly 160, electrically coupled to the upper electrode assembly 102 and the lower electrode assembly 104. As described in more detail below, the upper electrode assembly 102 may be arranged to receive an AC signal from the AC voltage assembly 160 at a first phase angle, while the lower electrode assembly 104 is arranged to receive the AC signal at a second phase angle, the second phase angle being 180 degrees shifted from the first phase angle.

In brief, the provision of an AC voltage signal (see AC voltage assembly 160 of FIG. 1) to the electrodes of apparatus 100 facilitates deflection of ions along different trajectories according to their mass and arrival time in the entrance aperture 106. In various non-limiting embodiments, the AC signal may have a frequency of 200 kHz to 100 MHz. Moreover, in some embodiments, the AC signal may have a voltage where a maximum voltage amplitude is between 1 kV to 100 kV. As detailed below, within such energy range and frequency range, ions having different mass may be conveniently filtered when traveling through an electrodynamic mass analysis device, such as the apparatus 100.

FIG. 1B illustrates general features of the geometry for mass filtering performed by the apparatus of FIG. 1A, showing the various components inside enclosure 103, as well as an ion beam 150. The ion beam 150 may enter the enclosure 103 from the left through entrance aperture 106 (see FIG. 1A). The ion beam 150 may include process ions 154, shown as curved trajectories, and representing ions of a targeted mass for use in implantation, for example. Other impurity species may be present in the ion beam 150 before entering the enclosure 103. These impurities are represented by the ions 152. By application of an AC voltage signal having an appropriate frequency, as well as voltage amplitude, the process ions 154 are deflected in the trajectories shown in the solid curves, and exit the enclosure 103 via the exit aperture 108 (see FIG. 1A), generally parallel to the beam axis 101 and close enough to the beam axis 101 to exit through the exit aperture 108, as shown. Upon exit along the beam axis, such ions may then be transported downstream to a substrate to be processed.

The ions 152 have a different mass than the mass of process ions 154. Again, by appropriate selection of various parameters, the ions 152 may be deflected along trajectories that cause the ions 152 to be captured within the enclosure 103, or may be caused to exit through exit aperture 108 along trajectories that are not parallel to the beam axis 101, and thus to not strike a substrate to be processed. These various parameters may include frequency of the applied AC voltage, voltage amplitude, as well as the geometrical arrangement of various components within the enclosure 103.

FIG. 2A shows one scenario for operating the apparatus 100 of FIG. 1A, according to other embodiments of the disclosure. In this scenario, a 20 keV $^{11}B^+$ ion beam enters the apparatus 100 from the left. The boron ions represent the targeted ions to be transported through the apparatus 100, with minimal filtering loss. The ion beam 202 is made of individual ions traveling with a velocity determined by their energy and mass, generally along the beam axis 101 during entry into the enclosure 103. The scenario of FIG. 2A represents the simulation of the trajectories of various different ions that enter the enclosure at different instances. An AC signal is applied to generate a 2 MHz sinusoidally varying time-dependent field in the vertical direction (Y-axis) with a maximum amplitude of 2E5V/m. The AC signal is applied in a manner so that at any given instance, electrodes of the upper electrode assembly 102 are driven by a first voltage signal that is 180 degrees out of phase with a second voltage signal at the lower electrode assembly 104. This phase shift establishes the time-dependent electric field along the Y-axis. The electric fielded is shielded in portions of the enclosure 103 that are grounded, such as between upper portion 116 and lower portion 118 of the ground tunnel, and also in a region just upstream of the upper exit electrode 132 and lower exit electrode 134. As shown by the various trajectories, representing different arrival times, corresponding to different phases of the AC signal, the ion beam 202 returns to the original line of flight and the original angle, oriented along the beam axis 101, regardless of the phase (arrival time) for different ions. In the example of FIG. 2A, the dimensions (shown in meters) are such that the ions of ion beam 202 traverse through the enclosure 103 in approximately one cycle (360 degrees).

As the ions enter the enclosure 103, the electric field appears on for approximately 65° adjacent the upper entrance electrode 112 and lower entrance electrode 114. The electric field appears off for approximately 65°, adjacent the ground tunnel, on for approximately 175°, in the left portion of the main chamber 120, off for approximately 65° and then on for approximately 65°, toward the right of the main chamber 120 and left of the exit chamber 130. This arrangement causes the trajectory of any given ion to be bent initially in the entrance chamber 110, to drift in a straight line adjacent the ground tunnel, to be bent again in the initial portion of the main chamber 120, to drift in a straight line while exiting the main chamber 120, and to again be bent in the exit chamber 130.

FIG. 2B shows the trajectories of impurity ions having a mass of 1 amu, according to the scenario for operating the apparatus 100 of FIG. 2A. Thus, the same AC voltage signal is applied to deflect the ions 204, as the AC voltage signal used to deflect the ions 202. Because the mass of the ions 204 is much lighter than for ions 202, the ions 204 travel through the enclosure 103 much faster, and after being deflected in an initial direction, off of the beam axis 101, are collected in the interior walls, because the electric field does not switch rapidly enough to reverse the initial deflection.

FIG. 2C shows the trajectories of impurity ions having a mass of 40 amu, according to the scenario for operating the apparatus 100 of FIG. 2A. In this example, the much heavier ions, ions 206, travel much more slowly than ions 202, will experience less transverse deflection along the Y-axis, and may be deflected through multiple cycles while traveling through the enclosure 103. The ions 206 thus tend to travel along more overall linear trajectories as shown, while some ions, depending upon their arrival time in the apparatus 100, may tend to travel along the beam axis 101 or close to the beam axis 101. To ensure that such heavier ions are properly screened, the beam blocker 109 may be provided to extend across the beam axis 101 and to intercept any ions traveling along the beam axis 101. Notably any of the ions 206, tending to exit through exit aperture 108 will exhibit trajectories that are not parallel to the beam axis 101, and may be intercepted at different components downstream, before striking a substrate.

FIG. 2D shows a calculated filter profile for the apparatus of FIG. 1A, based upon filtering for mass in the range of 10-11 amu (boron).

In accordance with various embodiments of the disclosure, the dimensions and the operation of the apparatus 100 may be engineered to accommodate a wide variety of ion beam sizes, ion energies, ion masses and AC frequencies. These parameters are related by the simple equation $$L = \frac{n}{f}\sqrt{\frac{2E}{m}} \quad \text{Eq 1}$$

where L is the length from the entrance to the exit of the enclosure 103, n is the number of cycles of the AC voltage of frequency f, E is the ion energy and m is the ion mass. The parameter n depends on the detailed trajectory chosen, and may in general be an integer or non-integer value. In the arrangement of FIG. 2A, n is chosen to be 1. Table 1 shows a sample of the possible masses, energies, frequencies and lengths that may be used to filter different ions. The minimum length may be limited by the geometry of the incoming ion beam: in order to achieve good separation, the length has to be more than approximately 10 times the height of the ion beam along the Y-axis. If the incoming ion beam has a wide range of angles, the length should be short enough that the initial angle spread does not overcome the mass separation. As dimensions of enclosure 103 on the order of several centimeters to less than one meter may accommodate many well-known implant species for mass filtering, using frequencies in the range of hundreds of kHz to less than 10 MHz. The embodiments are not limited in this context. In view of the above, according to some embodiments, the enclosure 103 may be constructed to have a targeted length for a given implant species. Thus, given an AC voltage assembly operating at 2 MHz, for 10 KeV energy, an enclosure 103 having a length of 0.21 M may be to construct an EDMA device appropriate for transmitting boron ions, while an EDMA device using enclosure 103 having a length of 0.12 m may be appropriate for transmitting 10 keV phosphorous ions.

TABLE I

| | Ion | | | | | | | | | | | |
|---|---|---|---|---|---|---|---|---|---|---|---|---|
| | H | | | B | | | P | | | As | | |
| Mass (amu) | 1 | 1 | 1 | 11 | 11 | 11 | 31 | 31 | 31 | 75 | 75 | 75 |
| Energy (keV) | 1 | 5 | 10 | 10 | 10 | 20 | 10 | 10 | 30 | 10 | 30 | 30 |
| Frequency (kHz) | 6780 | 6780 | 2000 | 2000 | 6780 | 2000 | 1200 | 2000 | 2000 | 800 | 1200 | 2000 |
| Length (m) | 0.06 | 0.14 | 0.69 | 0.21 | 0.06 | 0.30 | 0.21 | 0.12 | 0.22 | 0.20 | 0.23 | 0.14 |

Notably, in other embodiments, a given EDMA device having a given length of enclosure 103 (along the Z-axis), may be used to transmit different ion species by changing the frequency applied to the electrodes or the energy of the incoming beam, as appropriate. Table II provides a set of ion energies corresponding to a length L (see Eq. 1) of 0.3 m for enclosure 103, as a function of AC voltage frequency for hydrogen (amu=1), boron (amu=11), phosphorous (amu=31), and arsenic (amu=75).

TABLE II

| | | M(amu) | | | |
|---|---|---|---|---|---|
| | | 1 | 11 | 31 | 75 |
| L (m) = | 0.3 | | Energy (keV) | | |
| Frequency (kHz) | 800 | 0.3 | 3.3 | 9.3 | 23 |
| | 1200 | 0.7 | 7.4 | 21 | 507 |
| | 2000 | 1.9 | 21 | 58 | 141 |
| | 6780 | 22 | 217 | 6S9 | 1619 |

As shown in table II., for a given ion energy (e.g. 22 keV+/−1 eV), the frequency of the AC voltage decreases with increasing mass (showing a square root dependence), but well within the range of commercially available RF supplies. Thus, different AC voltage (RF voltage in this case) supplies may be used as appropriate to drive the same enclosure having a given length L, in order to transmit ions of different masses for a given ion energy.

More generally, the dimensions of drift regions, deflection regions, and number of different regions may be tailored to optimize EDMA device performance.

Figure 2F:
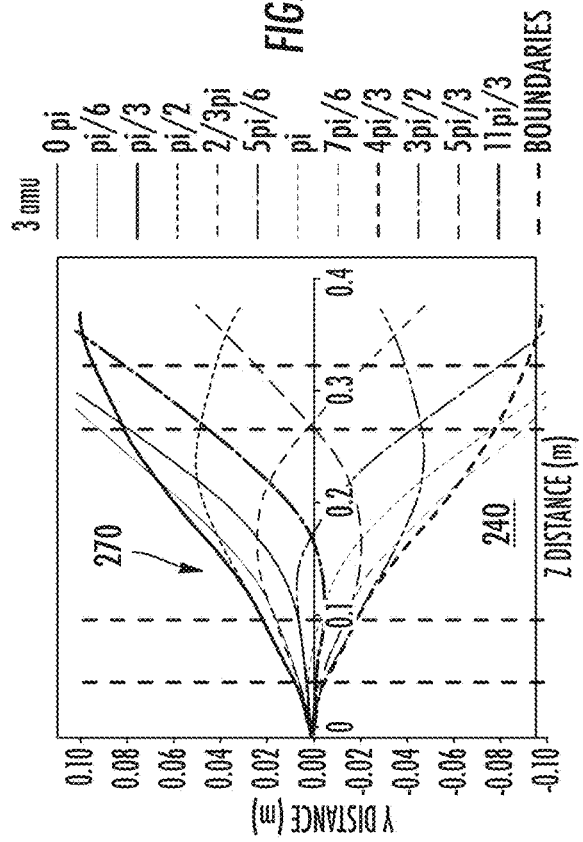
FIG. 2F illustrates simulated 3 amu impurity ion trajectories for operating under the conditions of FIG. 2E.
Figure 2G:
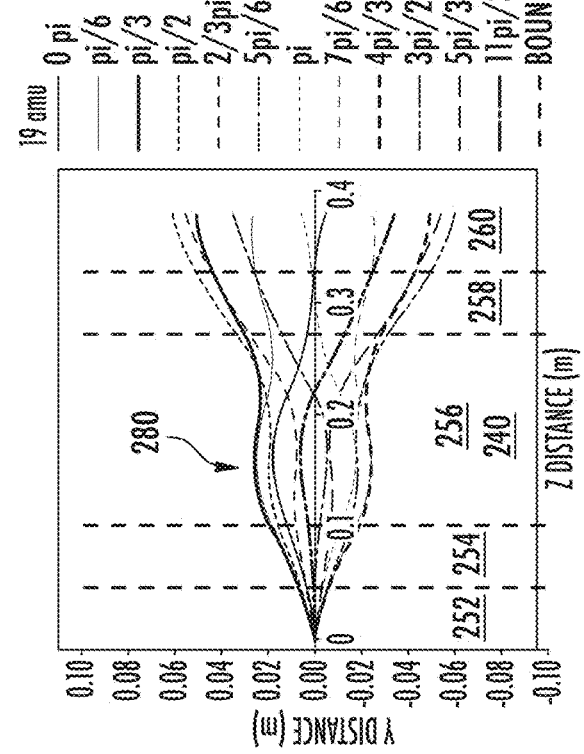
FIG. 2G illustrates simulated 19 amu impurity ion trajectories for operating under the conditions of FIG. 2E.
Figure 2E:
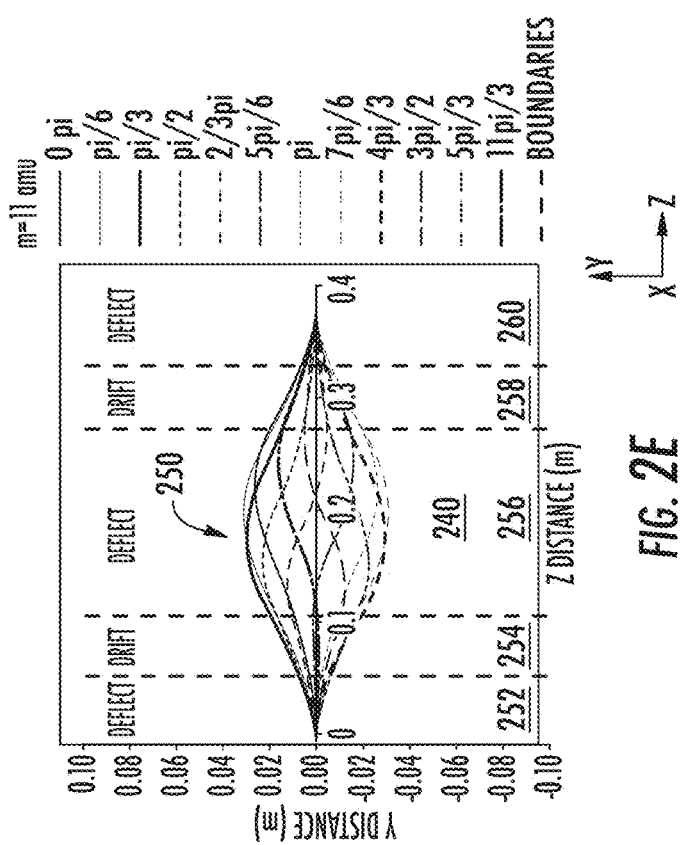
FIG. 2E illustrates simulated 11 amu target ion trajectories for operating an apparatus in accordance with embodiments of the disclosure.

FIG. 2E illustrates simulated 11 amu target ion trajectories for operating an apparatus 240 in accordance with embodiments of the disclosure. In this example, the ion trajectories are simulated trajectories for 20 keV $^{11}$B$^+$ ion beam by a 2 MHz sinusoidally varying time dependent field in the Y-axis direction with a maximum amplitude of 2E5V/m. The apparatus is generally arranged as in apparatus 100, while no beam blocker is present. Again, the ions 250 travel from left to right with different trajectories representing different ion arrival times. The apparatus is divided into different sections according to whether a deflecting electric field is present, including deflection region 252, drift region 254, deflection region 256, drift region 258, and deflection region 260. As with FIG. 2A, the ion trajectories all diverge and then reconverge on a beam axis (0.00 in the Z-direction). Thus, boron ions will tend to proceed through the apparatus 240.

FIG. 2F illustrates simulated 3 amu impurity ion trajectories for operating under the conditions of FIG. 2E. In this example, the lighter ions, ions 270, are again collected off the beam axis and do not complete a cycle, showing divergent paths to the right of the apparatus 240

FIG. 2G illustrates simulated 19 amu impurity ion trajectories for operating under the conditions of FIG. 2E. In this case, the heavier ions, ions 280, are deflected through more than one cycle, but again do not converge along the beam axis.

Figure 3B:
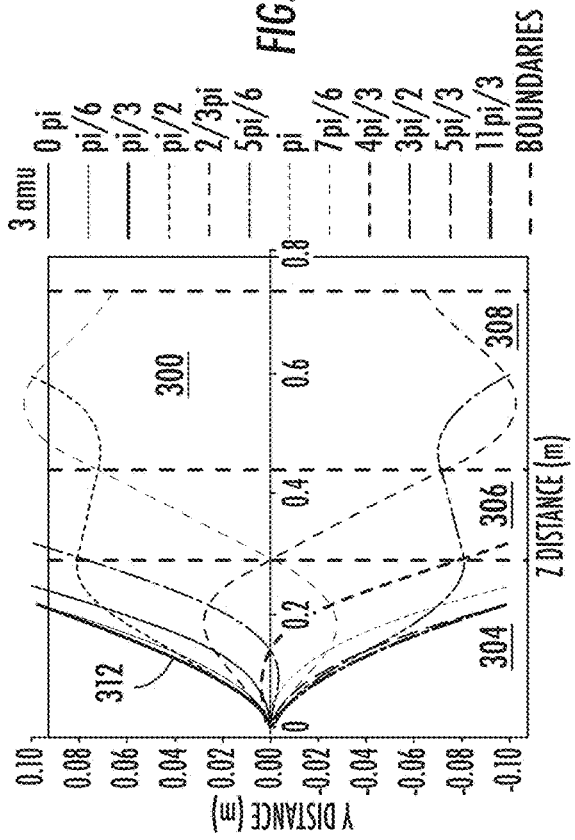
FIG. 3A, FIG. 3B, and FIG. 3C illustrate simulated 11 amu, 3 amu, and 19 amu ion trajectories, respectively, for operating another apparatus in accordance with embodiments of the disclosure.
Figure 3C:
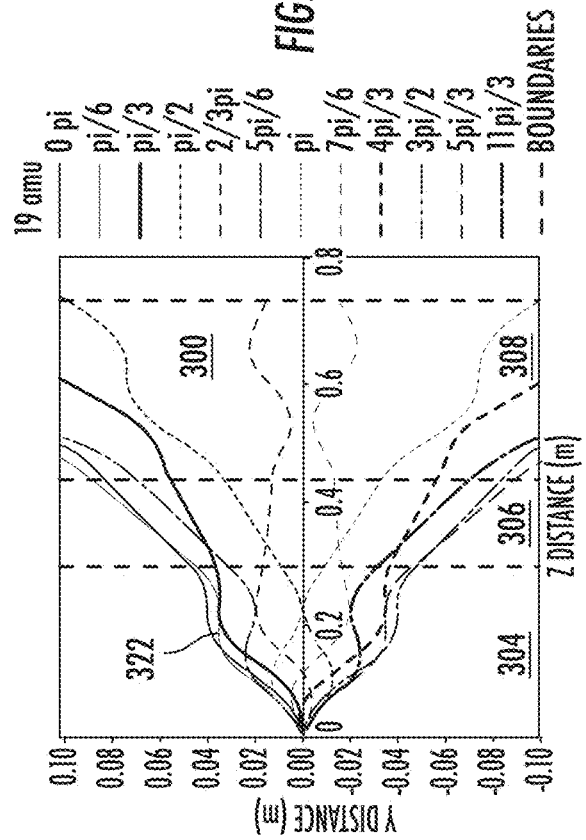
Figure 3A:
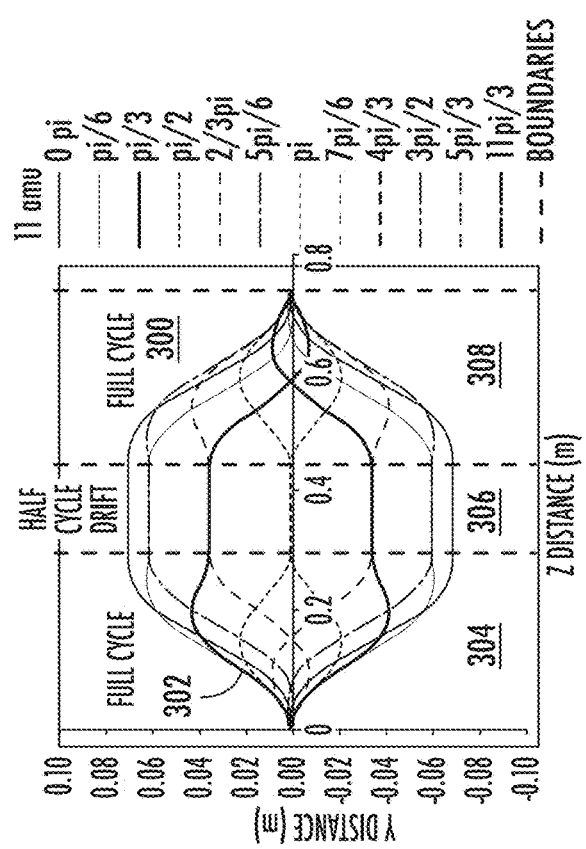

FIG. 3A, FIG. 3B, and FIG. 3C illustrate simulated 11 amu, 3 amu, and 19 amu ion trajectories, respectively, for operating another apparatus in accordance with embodiments of the disclosure. In this example, the apparatus 300 is arranged with a first deflection region 304, drift region 306, and second deflection region 308. Thus, the powered electrodes (not shown) in the apparatus 300 may be arranged toward the entrance of an enclosure and toward the exit of the enclosure, while a grounded region is disposed in the middle of the enclosure.

In FIG. 3A, a transverse deflection of a 20 keV $^{11}$B$^+$ ion beam by a 2 MHz sinusoidally varying time dependent field in the vertical direction with a maximum amplitude of 2E5V/m. The apparatus 300 is shown in very schematic form where the dimensions along the Z-axis for various regions are sized to treat the ion beam over 2.5 AC cycles (n=5/2) for the given frequency of the AC field. The field is shielded in the regions marked "drift". The various curves represent trajectories of different ions of the ion beam, entering the apparatus 300 at different times. The trajectories of the different ions of the ion beam returns to the original line of flight (beam axis) and original angle regardless of the phase with which the particular ion of the ion beam enters the system. In region first deflection region 304, the field is on for a full cycle, then shielded for a half cycle in drift region 306, and then on again for a full cycle in second deflection region 308. The ions 302 diverge and then converge along a beam axis as shown.

In FIG. 3B, the 3 amu ions, ions 312, travel much more rapidly through apparatus 300 and are not deflected through a full cycle, with divergent trajectories as shown. In FIG. 3C, the 19 amu ions, ions 322, are deflected in the apparatus 300 through more than one cycle, while generally diverging away from the beam axis, or in some occasions exiting along non-parallel directions. Thus, just 20 keV $^{11}$B$^+$ ions propagate through the apparatus 300 and exit at the proper position and along the proper direction.

Figure 4:
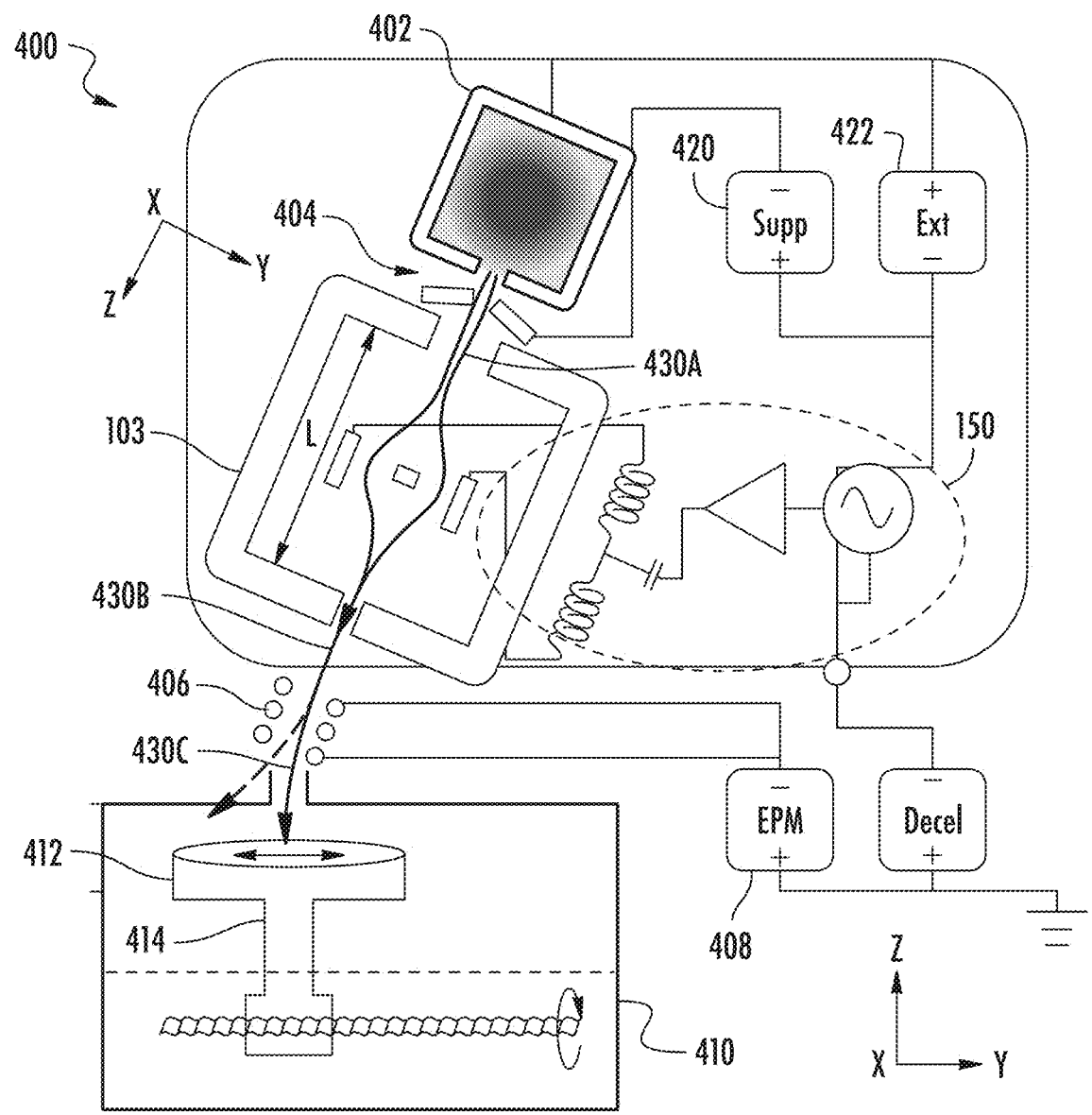
FIG. 4 depicts an exemplary system, arranged in accordance with embodiments of the disclosure.

As noted, an EDMA device arranged according to the present embodiments may be used to replace a magnetic mass analyzer, such as a known magnetic mass analyzer, used in beamline ion implanters. Moreover, the EDMA devices of the present embodiments may be used to construct a novel compact ion implantation apparatus having mass analysis capabilities. FIG. 4 depicts a novel ion implantation system, shown as system 400. In this embodiment, the apparatus 100 includes an ion source 402. According to some variants, the ion source 402 may include a plasma chamber, excited by any suitable method, to generate a given ion species. The system 400 may include extraction optics 404, coupled to a suppression supply 420 and an extraction supply 422, to extract an ion beam 430A, such as a ribbon beam (having a long axis along the X-axis).

The apparatus 100, including enclosure 103, having an electrode assembly disposed therein, and generally configured as described above with respect to FIG. 1, is disposed downstream of extraction optics 404. The enclosure 103 is coupled to receive the ion beam 430A, where the ion beam 430A includes unanalyzed ions, where targeted ions for implantation may be mixed with impurity ions. The enclosure 103 is coupled to receive an AC voltage signal from AC voltage assembly 160, to perform mass analysis, as described above. Notably, the AC voltage assembly may include known components, including generators, resonators, and circuitry to provide phase delay between voltage signals applied to the upper electrode assembly 102 and the lower electrode assembly 104. Accordingly, a mass analyzed ion beam 430B is directed out of the enclosure 103.

The system 400 further includes a process chamber 410, disposed downstream of the enclosure 103, to receive a mass analyzed ion beam and expose a substrate 412 to the mass analyzed ion beam. In some embodiments, a substrate stage 414 may be provided in the process chamber 410, to scan the substrate 412, for example, along the Y direction, where the mass analyzed ion beam may be elongated along the X-direction. In this manner, the entirety of the substrate 412 may be exposed to the mass analyzed ion beam 430B. As suggested in FIG. 4, and according to optional embodiments, the system 400 may include an energy filter 406, arranged according to known electrostatic energy filters, to filter out ions an energetic neutrals that do not have the targeted final ion energy. To accomplish this energy filtering, the energy filter 406 may be coupled to a voltage source 408, arranged to deflect the mass analyzed ion beam 430B from a first axis, such as the beam axis in the enclosure 103, to a process axis, which axis may be perpendicular to the plane of the substrate 412. The energy filter may also include an accelerating or decelerating voltage to control the final energy of the beam.

Thus, a mass analyzed, energy filtered ion beam 430C may be provided to the substrate 412. Notably, in embodiments where the enclosure 103 has the dimensions on the order of several tenths of one meter, the entire distance between ion source 402 and process chamber 410 may be on the order of 1 meter or less.

Figure 5:
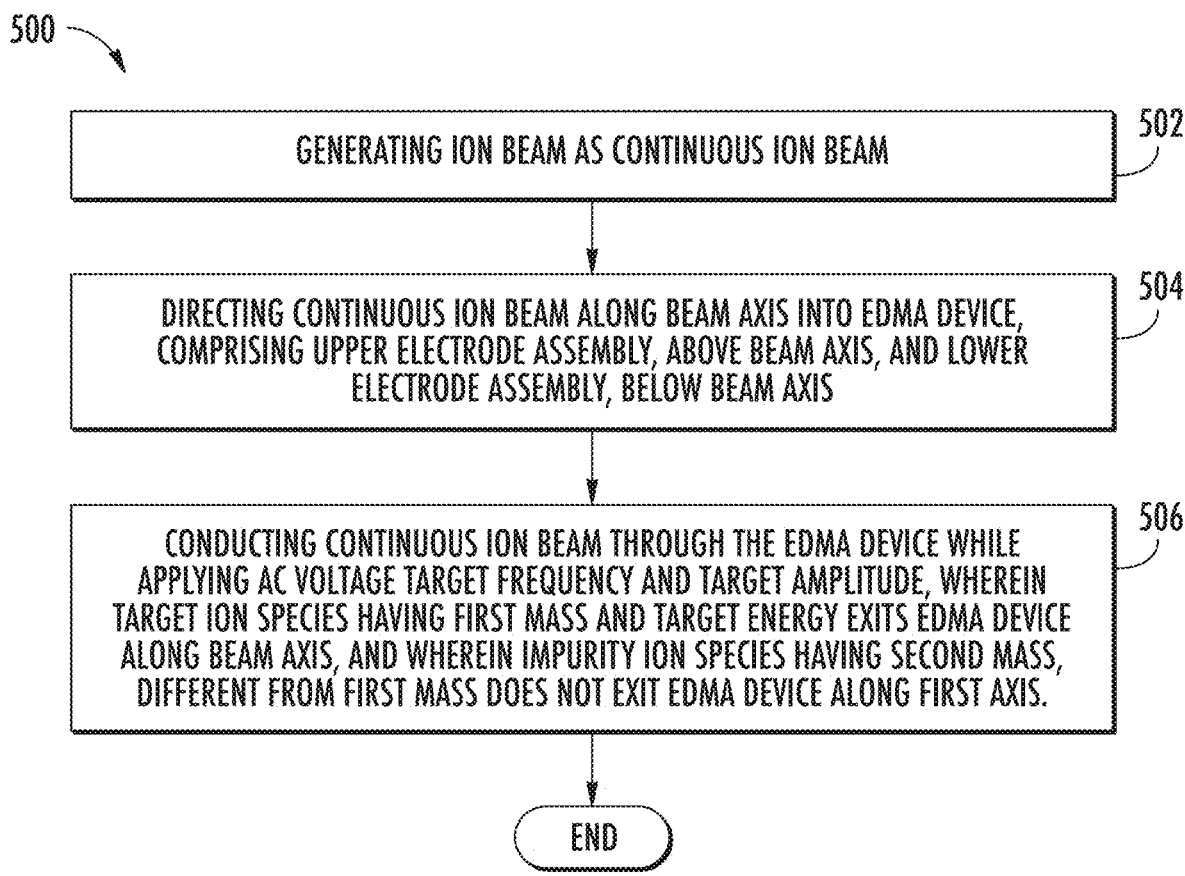
FIG. 5 depicts an exemplary process flow according to some embodiments of the disclosure.

FIG. 5 depicts an exemplary process flow 500 according to some embodiments of the disclosure. At block 502, an ion beam is generated as a continuous ion beam. The ion beam may be generated by any convenient means according to various embodiments.

At block 504, the continuous ion beam is directed along a beam axis into an electrodynamic mass analysis (EDMA) device. The EDMA device may include an upper electrode assembly and lower electrode assembly, where the upper electrode assembly is disposed above the beam axis and lower electrode assembly is disposed below the beam axis.

At block 506, the continuous ion beam is conducted through the EDMA device while applying an AC voltage at a target frequency and target amplitude. The target frequency may be tuned according to the energy of the continuous ion beam and the target ion species to be transmitted through the EDMA device. As such, the target ion species having a first mass and a target energy exits the EDMA device along the beam axis, while ion species having a second mass, different from the target mass does not exit the EDMA device along the beam axis. In this manner, the impurity ion species may be filtered from continuing to propagate along the beam axis toward a substrate to be implanted.

In view of the foregoing, at least the following advantages are achieved by the embodiments disclosed herein. A first advantage is realized by providing a more compact mass analysis component for mass analyzing an ion beam. A second advantage is expense saved in providing an EDMA type system for mass analysis. A third advantage is provided in that high frequency AC fields used to perform mass analysis according to the present embodiments will probably not transport particles, and thus reduce particle contamination. A further advantage is the relatively higher throughput of the mass analyzer according to the present embodiments, simulated to be above 50% and in some cases as high as 70%.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An apparatus, comprising:
 a housing including an entrance aperture, to receive an ion beam;
 an exit aperture, disposed in the housing, downstream to the entrance aperture, the entrance aperture and the exit aperture defining a beam axis, extending therebetween;
 an electrodynamic mass analysis assembly disposed in the housing and comprising:
  an upper electrode assembly, disposed above the beam axis; and
  a lower electrode assembly, disposed below the beam axis; and
 an AC voltage assembly, electrically coupled to the upper electrode assembly and the lower electrode assembly, wherein the upper electrode assembly is arranged to receive an AC signal from the AC voltage assembly at a first phase angle, and wherein the lower electrode assembly is arranged to receive the AC signal at a second phase angle, the second phase angle being 180 degrees shifted from the first phase angle.

2. The apparatus of claim 1, wherein the upper electrode assembly comprises:
 an upper entrance electrode, disposed in an entrance chamber of the housing;
 a main upper electrode assembly, disposed in a main chamber of the housing, downstream to the upper entrance electrode; and
 an upper exit electrode, disposed in the main chamber of the housing, downstream to the main upper electrode assembly; and
 wherein the lower electrode assembly comprises:
 a lower entrance electrode, disposed in the entrance chamber;

a main lower electrode assembly, disposed in the main chamber, downstream to the lower entrance electrode; and a lower exit electrode, disposed downstream to the main lower electrode assembly.

3. The apparatus of claim 2, wherein the main upper electrode assembly and the main lower electrode assembly define a flared relationship, wherein a separation between the main upper electrode assembly and the main lower electrode assembly increases between an upstream position of the main chamber and a downstream position of the main chamber.

4. The apparatus of claim 2, further comprising a beam blocker, the beam blocker being disposed in the main chamber and extending across the beam axis, the beam blocker being set at ground potential.

5. The apparatus of claim 2, wherein the entrance chamber further comprises a ground tunnel, disposed downstream of the upper entrance electrode and the lower entrance electrode, the ground tunnel having an upper portion disposed above the beam axis and a lower portion, disposed below the beam axis.

6. The apparatus of claim 1, wherein the AC signal comprises a frequency of 200 kHz to 100 MHz.

7. The apparatus of claim 1, wherein the electrodynamic mass analysis assembly comprises a plurality of electrodes, the plurality of electrodes being elongated along an electrode axis, the electrode axis extending perpendicularly to the beam axis.

8. The apparatus of claim 1, wherein the AC signal comprises a maximum voltage amplitude of 1 kV to 100 kV.

9. A system, comprising:
an ion source, disposed to generate an ion beam;
an electrodynamic mass analysis device, comprising:
an entrance aperture, disposed to receive the ion beam;
an exit aperture, disposed downstream to the entrance aperture, the entrance aperture and the exit aperture defining a beam axis, extending therebetween;
an upper electrode assembly, disposed above the beam axis; and
a lower electrode assembly, disposed below the beam axis; and
a process chamber, disposed downstream of the exit aperture, the process chamber comprising a substrate stage; and
an AC voltage assembly, electrically coupled to the upper electrode assembly and the lower electrode assembly.

10. The system of claim 9, wherein the upper electrode assembly is arranged to receive an AC signal from the AC voltage assembly at a first phase angle, and wherein the lower electrode assembly is arranged to receive the AC signal at a second phase angle, the second phase angle being 180 degrees shifted from the first phase angle.

11. The system of claim 9, further comprising an electrostatic energy filter, disposed between the exit aperture and the process chamber, wherein the electrostatic energy filter is arranged to deflect the ion beam from the beam axis to a process axis, over an angular range of 10 degrees to 60 degrees.

12. The system of claim 10, wherein the upper electrode assembly comprises:
an upper entrance electrode, disposed in an entrance chamber of the housing;
a main upper electrode assembly, disposed in a main chamber of the housing, downstream to the upper entrance electrode; and
an upper exit electrode, disposed in the main chamber of the housing, downstream to the main upper electrode assembly; and
wherein the lower electrode assembly comprises:
a lower entrance electrode, disposed in the entrance chamber;
a main lower electrode assembly, disposed in the main chamber, downstream to the lower entrance electrode; and
a lower exit electrode, disposed downstream to the main lower electrode assembly.

13. The system of claim 12, wherein the main upper electrode assembly and the main lower electrode assembly define a flared relationship, wherein a separation between the main upper electrode assembly and the main lower electrode assembly increases between an upstream position of the main chamber and a downstream position of the main chamber.

14. The system of claim 12, further comprising a beam blocker, the beam blocker being disposed in the main chamber and extending across the beam axis, the beam blocker being set at ground potential.

15. The system of claim 12, wherein the entrance chamber further comprises a ground tunnel, disposed downstream of the upper entrance electrode and the lower entrance electrode, the ground tunnel having an upper portion disposed above the beam axis and a lower portion, disposed below the beam axis.

16. The system of claim 12, wherein the AC signal comprises a frequency of 200 kHz to 100 MHz and a maximum voltage amplitude of 1 kV to 100 kV.

17. The system of claim 9, wherein the electrodynamic mass analysis device comprises a plurality of electrodes, the plurality of electrodes being elongated along an electrode axis, the electrode axis extending perpendicularly to the beam axis.

18. A method of processing an ion beam, comprising:
generating the ion beam as a continuous ion beam;
directing the continuous ion beam along a beam axis into an electrodynamic mass analysis (EDMA) device, the EDMA device comprising an upper electrode assembly, disposed above the beam axis, and a lower electrode assembly, disposed below the beam axis; and
conducting the continuous ion beam through the EDMA device while applying an AC voltage signal at a target frequency and a target voltage amplitude to the upper electrode assembly and to the lower electrode assembly,
wherein a target ion species having a first mass exits the EDMA device along the beam axis, wherein an impurity ion species having a second mass, different from the first mass does not exit the EDMA device along the beam axis, and wherein a mass analyzed ion beam exits the EDMA device.

19. The method of processing an ion beam of claim 18, further comprising:
directing the mass analyzed ion beam through an energy filter, wherein a mass analyzed energy filtered ion beam is generated; and
directing the mass analyzed energy filtered ion beam to a substrate.

* * * * *

UNITED STATES PATENT AND TRADEMARK OFFICE
CERTIFICATE OF CORRECTION

| | | |
|---|---|---|
| PATENT NO. | : 10,763,072 B1 | Page 1 of 1 |
| APPLICATION NO. | : 16/354638 | |
| DATED | : September 1, 2020 | |
| INVENTOR(S) | : Frank Sinclair et al. | |

It is certified that error appears in the above-identified patent and that said Letters Patent is hereby corrected as shown below:

In the Drawings

Sheet 5, Fig. 4, replace the reference numeral "150" with --160--.

Signed and Sealed this
Sixth Day of May, 2025

Coke Morgan Stewart
*Acting Director of the United States Patent and Trademark Office*